United States Patent
Chien et al.

(10) Patent No.: US 9,461,811 B1
(45) Date of Patent: Oct. 4, 2016

(54) CLOCK AND DATA RECOVERY CIRCUIT AND CLOCK AND DATA RECOVERY METHOD

(71) Applicants: Global Unichip Corporation, Hsinchu (TW); Taiwan Semiconductor Manufacturing Co., Ltd., Hsin-Chu (TW)

(72) Inventors: Ting-Hsu Chien, Hsinchu County (TW); Jeng-Hung Tsai, Santa Clara, CA (US); Ming-Hsien Tsai, Hsinchu County (TW)

(73) Assignees: Global Unichip Corporation, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/794,830

(22) Filed: Jul. 9, 2015

(51) Int. Cl.
- H03D 3/24 (2006.01)
- H04L 7/033 (2006.01)
- H04L 7/00 (2006.01)
- H04L 7/04 (2006.01)

(52) U.S. Cl.
CPC ............. H04L 7/0025 (2013.01); H04L 7/042 (2013.01)

(58) Field of Classification Search
CPC ..... H04L 7/0025; H04L 7/033; H04L 7/087; H04L 7/0891; H04L 27/2273; H04L 2027/0057; H03L 7/235

USPC ........ 375/375, 259, 359, 376; 455/103, 127, 455/307, 325; 327/156
See application file for complete search history.

(56) References Cited

U.S. PATENT DOCUMENTS

| | | | | |
|---|---|---|---|---|
| 2007/0047683 | A1* | 3/2007 | Okamura | H03L 7/0814 375/355 |
| 2013/0070882 | A1* | 3/2013 | Nedovic | H03L 7/235 375/373 |
| 2014/0270031 | A1* | 9/2014 | Huang | H04L 7/0025 375/371 |
| 2015/0304097 | A1* | 10/2015 | Yu | H04L 7/0025 375/373 |

* cited by examiner

*Primary Examiner* — Khai Tran
(74) *Attorney, Agent, or Firm* — Jianq Chyun IP Office

(57) ABSTRACT

A clock and data recovery (CDR) circuit includes a phase detector, a phase interpolator, a finite state machine, and a divisor-controllable frequency divider. The phase detector compares an input data signal with a frequency dividing signal and generates a phase indication signal to indicate a phase difference between the input data signal and the frequency dividing signal. The phase interpolator performs phase interpolation on first and second clock signals received by the phase interpolator, so as to generate a phase interpolation signal. The finite state machine coupled to the phase detector and the phase interpolator generates the control signal based on the phase indication signal and the phase interpolation signal. The divisor-controllable frequency divider coupled to the phase detector and the phase interpolator divides the second frequency of the phase interpolation signal by a divisor so as to generate the frequency dividing signal. A CDR method is also provided.

13 Claims, 4 Drawing Sheets

CLOCK AND DATA RECOVERY CIRCUIT AND CLOCK AND DATA RECOVERY METHOD

BACKGROUND

1. Field of Invention

The invention generally relates to a clock and data recovery (CDR) circuit and a CDR method, and more particularly to a CDR circuit and a CDR method capable of obtaining a wide operation frequency range without degrading the performance of linearity.

2. Description of Prior Art

Clock and data recovery (CDR) circuits are generally used to sample an input data signal, extract the clock from the input data signal, and retime the sampled data in the receiver. In a conventional CDR circuit, a phase interpolator for adjusting the phase of the sampling clock is frequently employed.

Since the operation frequency range and linearity of the CDR circuit are critically affected by circuit characteristics of the phase interpolator, designer may need more time to develop a trade-off between the operation frequency range and the performance of linearity, whereas it is rather difficult to ensure the performance of both.

For example, in a conventional phase interpolator design, the operation frequency range can be increased by additionally arranging a switch capacitor array (SCA) at an output terminal. However, the effective capacitance at the output terminal of the phase interpolator may be increased because of parasitic capacitance caused by the SCA, and thus the linearity and the maximum operation speed of the phase interpolator may be reduced.

SUMMARY

The invention is directed to a clock and data recovery circuit and a clock and data recovery method, where the phase interpolator is capable of obtaining a wide operation frequency range without impairing the performance of linearity.

The invention is directed to a clock and data recovery (CDR) circuit including a phase detector, a phase interpolator, a finite state machine (FSM), and a divisor-controllable frequency divider. The phase detector compares an input data signal with a frequency dividing signal and generates a phase indication signal to indicate a phase difference between the input data signal and the frequency dividing signal. The phase detector is operated at a first frequency. The phase interpolator receives a first clock signal, a second clock signal, and a control signal, and the phase interpolator performs phase interpolation on the first and the second clock signals according to the control signal, so as to generate a phase interpolation signal. The phase interpolator is operated at a second frequency, and the second frequency is greater than the first frequency. The FSM is coupled to the phase detector and the phase interpolator, and the FSM generates the control signal based on the phase indication signal with the first frequency and the phase interpolation signal with the second frequency. The divisor-controllable frequency divider is coupled to the phase detector and the phase interpolator, and the divisor-controllable frequency divider divides the second frequency of the phase interpolation signal by a divisor, so as to generate the frequency dividing signal with the first frequency. The divisor is set according to a ratio of the first frequency and the second frequency.

In an embodiment of the invention, the phase interpolator is operated without changing frequency when the first frequency of the input data signal is changed.

In an embodiment of the invention, when the first frequency of the input data signal is changed, the divisor is adjusted according to the ratio of the changed first frequency being changed and the unchanged second frequency.

In an embodiment of the invention, when the phase indication signal is a phase leading signal, the FSM increases a signal level of the control signal step-by-step for each pulse of the phase interpolation signal within a pulse duration of the phase leading signal, and the signal level in each step is determined according to a pulse number of the phase interpolation signal within the pulse duration.

In an embodiment of the invention, the signal level of the control signal is raised from a reference signal level to a maximum signal level within the pulse duration, so as to constitute a rising edge of the control signal.

In an embodiment of the invention, when the phase indication signal is a phase lagging signal, the FSM decreases signal level of the control signal step-by-step for each pulse of the phase interpolation signal within the pulse duration of the phase lagging signal, and the signal level in each step is determined according to a pulse number of the phase interpolation signal within the pulse duration.

In an embodiment of the invention, the signal level of the control signal is dropped from a maximum signal level to a reference signal level within the pulse duration, so as to constitute a falling edge of the control signal.

In an embodiment of the invention, the CDR circuit further includes a phase-locked loop (PLL). The PLL is coupled to the phase interpolator and generates the first and the second clock signals.

In an embodiment of the invention, the CDR circuit further includes a de-serializer. The de-serializer is coupled to the phase detector and converts the input data signal into a parallel data signal according to the frequency dividing signal.

The invention is directed to a CDR method including following steps: receiving an input data signal by a phase detector and receiving a first clock signal and a second clock signal by a phase interpolator, wherein the phase detector is operated at a first frequency, and the phase interpolator is operated at a second frequency; performing phase interpolation on the first and the second clock signals according to a control signal, so as to generate a phase interpolation signal; dividing the second frequency of the phase interpolation signal by a divisor, so as to generate a frequency dividing signal with the first frequency, wherein the divisor is set according to a ratio of the first frequency and the second frequency; comparing the input data signal with the frequency dividing signal, so as to generate a phase indication signal to indicate a phase difference between the input data signal and the frequency dividing signal; generating and adjusting the control signal based on the phase indication signal with the first frequency and the phase interpolation signal with the second frequency; converting the phase indication signal into a parallel data signal.

In an embodiment of the invention, the CDR method further includes a step of, if the first frequency of the input data signal is changed, adjusting the divisor according to the ratio of the changed first frequency and the unchanged second frequency.

In an embodiment of the invention, the step of generating and adjusting the control signal based on the phase indication signal with the first frequency and the phase interpolation signal with the second frequency includes: when the phase indication signal is a phase leading signal, increasing a signal level of the control signal step-by-step for each pulse of the phase interpolation signal during rising time of the phase leading signal, wherein the signal level in each step is determined according to a pulse number of the phase interpolation signal during the rising time.

In an embodiment of the invention, the step of generating and adjusting the control signal based on the phase indication signal with the first frequency and the phase interpolation signal with the second frequency includes: when the phase indication signal is a phase lagging signal, decreasing a signal level of the control signal step-by-step for each pulse of the phase interpolation signal during rising time of the phase lagging signal, wherein the signal level in each step is determined according to a pulse number of the phase interpolation signal during the rising time.

Accordingly, the embodiments of the invention provide a CDR circuit and a CDR method. By utilizing the divisor-controllable frequency divider in the proposed CDR circuit, the phase interpolator can be designed at the frequency with the highest linearity regardless of the frequency of the input data signal. Therefore, since the linearity of CDR circuit is mainly dominated by the performance of the phase interpolator, the CDR circuit described herein can be characterized by the wide operation frequency range without sacrificing the performance of linearity.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF THE EMBODIMENTS

Figure 1:
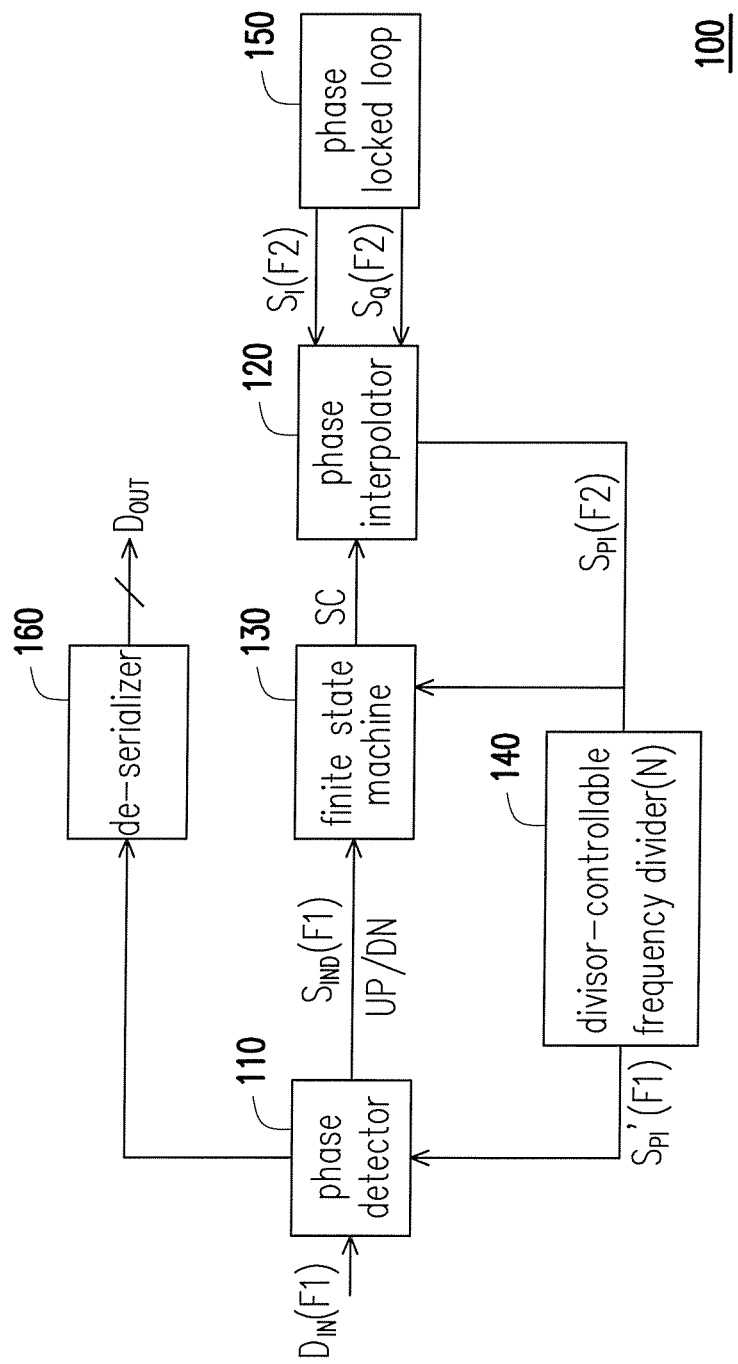
FIG. 1 is a block diagram of a clock and data recovery circuit according to an embodiment of the disclosure.

In order to make the disclosure more comprehensible, embodiments are described below as examples showing that the disclosure can actually be realized. The embodiments provided herein are only for an illustrative purpose, instead of limiting the scope of the disclosure. Moreover, wherever possible, the same reference numbers are used in the drawings and the description of embodiments to refer to the same or like parts.

FIG. 1 is a block diagram of a clock and data recovery circuit (CDR) according to an embodiment of the disclosure. In the present embodiment, the CDR circuit 100 can be disposed in a receiver for recovering clock of input data received from a transmitter. With reference to FIG. 1, the CDR circuit 100 includes a phase detector 110, a phase interpolator 120, a finite state machine (FSM) 130, a divisor-controllable frequency divider 140, a phase locked loop (PLL) 150, and a de-serializer 160.

The phase detector 110 is configured to compare an input data signal $D_{IN}$ with a frequency dividing signal $S_{PI}'$ outputted by the divisor-controllable frequency divider 140 and generate a phase indication signal $S_{IND}$ to indicate a phase difference between the input data signal $D_{IN}$ and the frequency dividing signal $S_{PI}'$. The phase detector 110 can determine the phase difference between the input data signal $D_{IN}$ and the phase interpolation signal $S_{PI}$ by sampling voltages, nearing the rising edge or the falling edge, of the input data signal $D_{IN}$ and the frequency dividing signal $S_{PI}'$ and comparing the sampled voltages to determine whether the phase of the input data signal $D_{IN}$ leads or falls behind the phase of the frequency dividing signal $S_{PI}'$. For example, when the input data signal $D_{IN}$ leads the phase of the frequency dividing signal $S_{PI}'$, the phase detector 110 may generate a phase leading signal DN as the phase indication signal $S_{IND}$. When the input data signal $D_{IN}$ falls behind the phase of the frequency dividing signal $S_{PI}'$, the phase detector 110 may generate a phase lagging signal UP as the phase indication signal $S_{IND}$.

In the present embodiment, the phase detector 110 is operated at a first frequency F1, which means frequencies of the received signals (i.e., the input data signal $D_{IN}$ and the frequency dividing signal $S_{PI}'$) and the generated signal (i.e., the phase indication signal $S_{IND}$) are the first frequency F1. Furthermore, the operation frequency of the phase detector 110 can be selected according to the frequency of the input data signal $D_{IN}$.

Besides, the signal received from the divisor-controllable frequency divider 140, by the phase detector 110, is considered as a recovered clock. The phase detector 110 further provides the recovered clock and the input data signal $D_{IN}$ to the de-serializer 160.

The phase interpolator 120 is coupled to the FSM 130, the divisor-controllable frequency divider 140, and the PLL 150. The phase interpolator 120 receives a first clock signal $S_I$ and a second clock signal $S_Q$ outputted from the PLL 150 and performs the interpolation operation on the first and the second clock signals $S_I$ and $S_Q$ according to the control signal $S_C$ outputted from the FSM 130, so as to generate a phase interpolation signal $S_{PI}$.

In the present embodiment, the phase interpolator 120 is operated at a second frequency F2, which means frequencies of the received signals (i.e., the first clock signal $S_I$ and the second clock signal $S_Q$) and the generated signal (i.e., the phase interpolation signal $S_{PI}$) are the second frequency F2. Furthermore, the operation frequency of the phase interpolator 120 can be selected for optimizing linearity of the phase interpolator 120. In the practice application, since the operation frequency of the phase detector 110 is selected according to the frequency of the input data signal $D_{IN}$, and the operation frequency of the phase interpolator 120 is selected for maximizing the linearity of the phase interpolator 120, the second frequency F2 is usually greater than the first frequency F1.

The FSM 130 is coupled to the phase detector 110 and generates a control signal $S_C$ based on the phase indication signal $S_{IND}$ with the first frequency F1 and the phase interpolation signal $S_{PI}$ with the second frequency F2, so as to control interpolation operation of the phase interpolator 120.

The divisor-controllable frequency divider 140 is coupled to the phase detector 110 and the phase interpolator 120. The divisor-controllable frequency divider 140 is configured to divide the second frequency F2 of the phase interpolation signal $S_{PI}$ by a divisor N, so as to generate the frequency dividing signal $S_{PI}'$ with the first frequency F1. In the present embodiment, the divisor N is set according to a ratio of the first frequency F1 and the second frequency F2. For example, if the first frequency F1 is 2.5 GHz, and the second frequency F2 is 40 GHz, the divisor N is then equal to 16.

The PLL 150 is coupled to the phase interpolator and generates a first clock signal $S_I$ and a second clock signal $S_Q$, where the first clock signal $S_I$ is an in-phase signal, and the second clock signal $S_Q$ is an quadrature signal having the same frequency with the first clock signal $S_I$, and the phases of the first clock signal $S_I$ and the second clock signal $S_Q$ are orthogonal to each other. In other words, the first clock signal $S_I$ and the second clock signal $S_Q$ have a phase difference of 90 degrees.

The de-serializer 160 is coupled to the phase detector 110 and converts the input data signal $D_{IN}$ into a parallel data signal $D_{out}$ according to the recovered clock (i.e., the frequency dividing signal $S_{PI}'$).

In the present CDR circuit 100 design, since the divisor N of the divisor-controllable frequency divider 140 can be set according to the ratio of the first frequency F1 and the second frequency F2, and the divisor-controllable frequency divider 140 divides the second frequency F2 into the first frequency F1, the phase interpolator 100 can be designed at the frequency with the highest linearity regardless of the frequency of the input data signal $D_{IN}$. In other words, the phase interpolator 120 is operated without changing frequency when the first frequency F1 of the input data signal $D_{IN}$ is changed.

On the other hand, according to the related art, a conventional FSM usually generates a control signal based on two reference signals having the same frequency. However, in an embodiment of the disclosure, the FSM 130 can generate the control signal $S_C$ based on two reference signals with different frequencies, such that the operation frequency of the phase interpolator 120 can be fixed for maintaining the linearity and does not need to be adjusted along with the frequency of the input data signal $D_{IN}$. Specific operation of the FSM 130 may be described in following embodiments.

Therefore, since the linearity of CDR circuit 100 is mainly dominated by the performance of the phase interpolator 120, the CDR circuit 100 provided in an embodiment of the invention can achieve features of wide operation frequency range without sacrificing the performance of linearity.

Figure 2A:
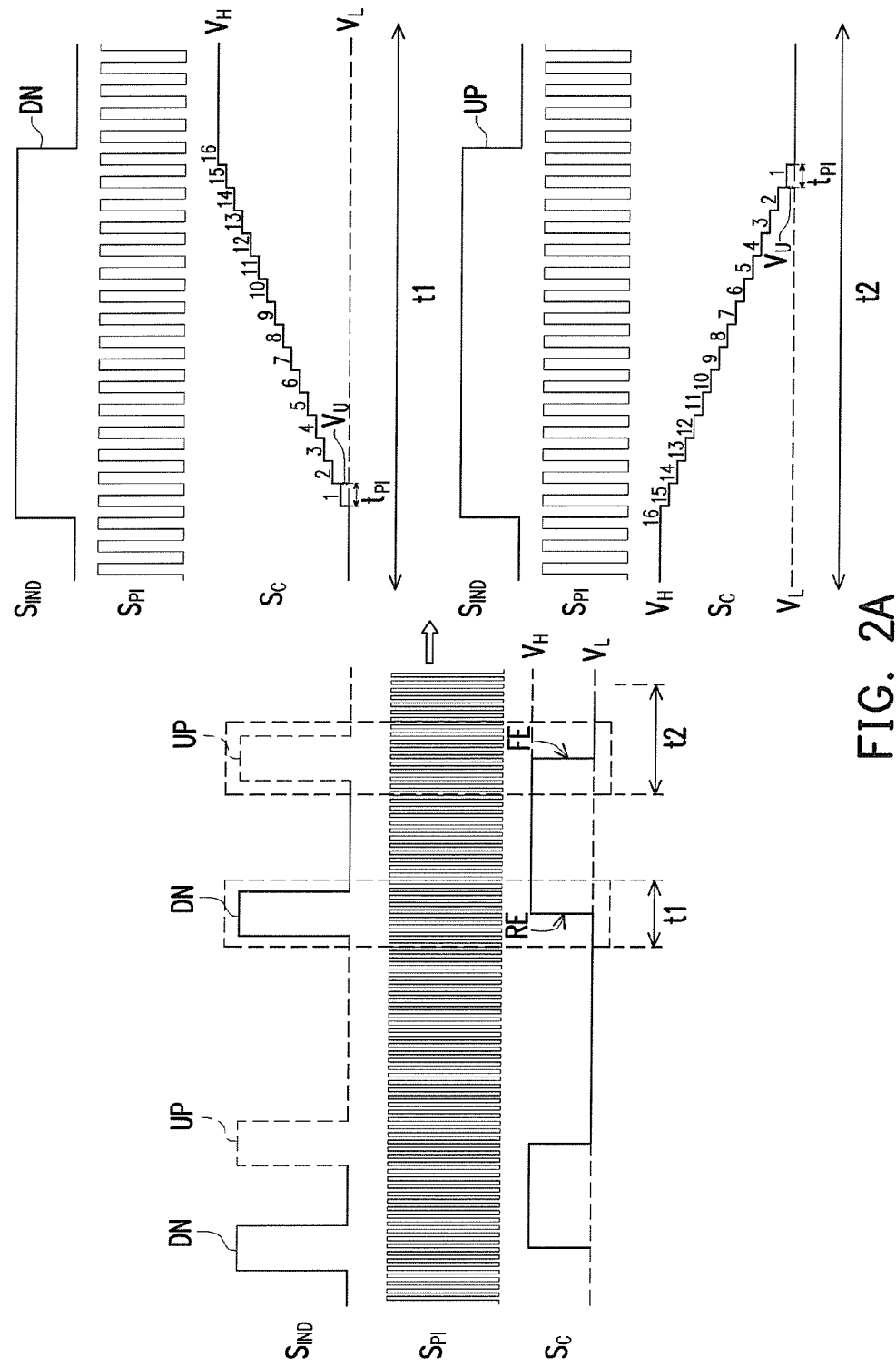
FIG. 2A is a signal waveform diagram of a clock and data recovery circuit according to an embodiment of the disclosure.
Figure 2B:
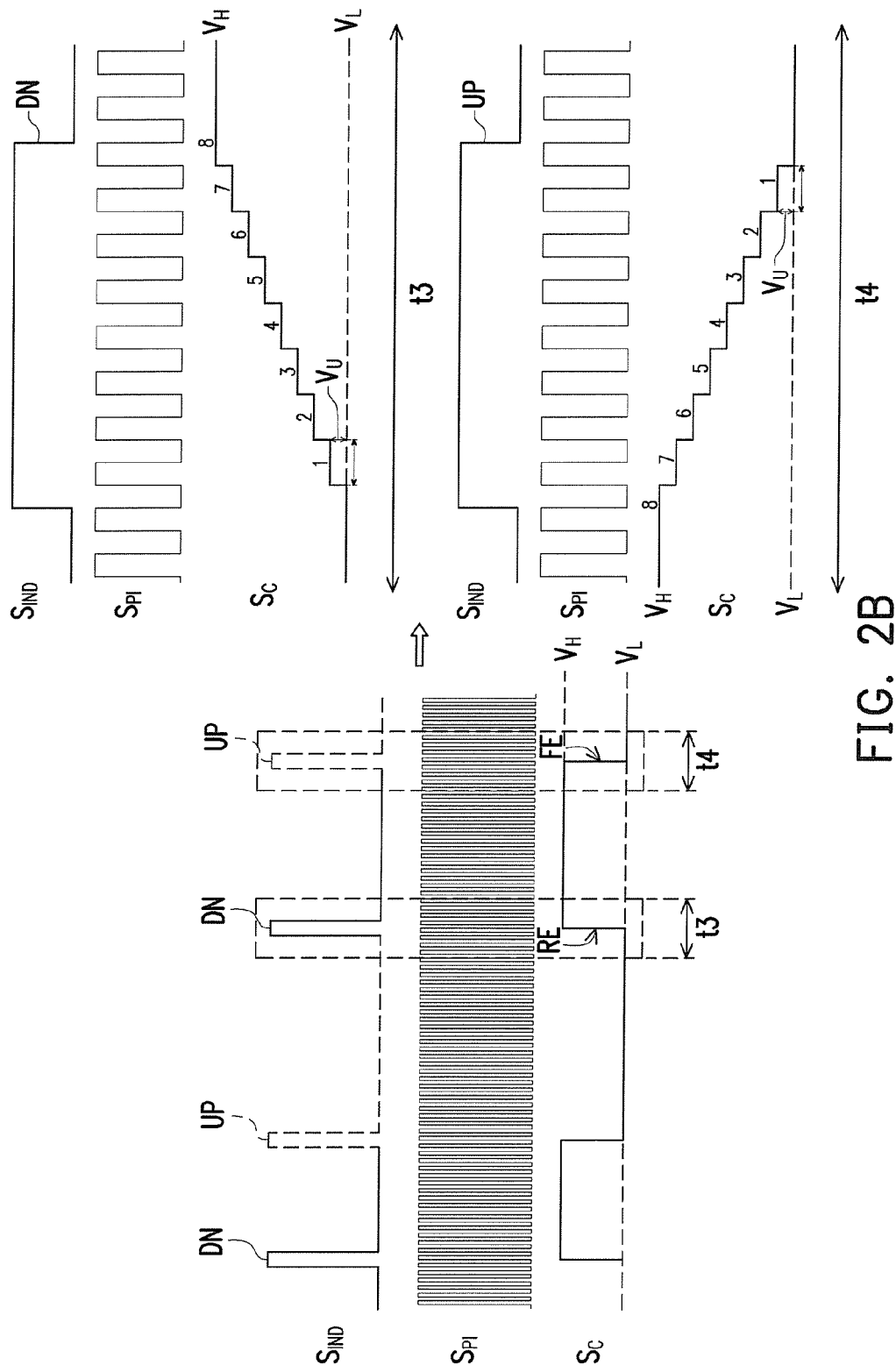
FIG. 2B is a signal waveform diagram of a clock and data recovery circuit according to another embodiment of the disclosure.

The following embodiments depicted in FIG. 2A and FIG. 2B are provided in order to make the operation of the FSM 130 clearer and more understandable. FIG. 2A is a signal waveform diagram of a CDR circuit according to an embodiment of the disclosure. FIG. 2B is a signal waveform diagram of a CDR circuit according to another embodiment of the disclosure.

As shown in FIG. 1 and FIG. 2A, the second frequency F2 is assumed to be 16 times as great as the first frequency F1 (i.e., the divisor N is equal to 16), so as to optimize the linearity. As to the waveforms during a period t1 of the phase indication signal $S_{IND}$, the phase interpolation signal $S_{PI}$, and the control signal $S_C$, the phase leading signal DN is pulled high during the period t1, which means the phase of the input data signal $D_{IN}$ falls behind the phase of the frequency dividing signal $S_{PI}'$/the phase interpolation signal $S^{PI}$.

During the period t1, the FSM 130 may increase a signal level of the control signal $S_C$ step-by-step for each pulse of the phase interpolation signal $S_{PI}$. For example, the signal level of the control signal $S_C$ raises a unit signal level $V_U$ from a reference signal level $V_L$ during a period $t_{PI}$ of the phase interpolation signal $S_{PI}$, then again raises the unit signal level $V_U$ during the next period of the phase interpolation signal $S_{PI}$ until the maximum signal level $V_H$ is reached. Accordingly, the signal level of the control signal $S_C$ may be raised from the reference signal level $V_L$ to the maximum signal level $V_H$ within the pulse duration of the phase leading signal DN, so as to constitute a rising edge RE of the control signal $S_C$.

On the other hand, as to the waveforms during a period t2 of the phase indication signal $S_{IND}$, the phase interpolation signal $S_{PI}$, and the control signal $S_C$, the phase leading signal DN is pulled low during the period t2, which means the phase of the input data signal $D_{IN}$ leads the phase of the frequency dividing signal $S_{PI}'$/the phase interpolation signal $S_{pi}$.

During the period t2, the FSM 130 may decrease the signal level of the control signal $S_C$ step-by-step for each pulse of the phase interpolation signal $S_{PI}$. For example, the signal level of the control signal $S_C$ falls behind a unit signal level $V_U$ from the maximum signal level $V_H$ during a period $t_{PI}'$ of the phase interpolation signal $S_{PI}$, then again falls behind the unit signal level $V_U$ during the next period of the phase interpolation signal $S_{PI}$ until the reference signal level $V_L$ level is reached. Accordingly, the signal level of the control signal $S_C$ may be dropped from the maximum signal level $V_H$ to the reference signal level $V_L$ within the pulse duration of the phase lagging signal UP, so as to constitute a falling edge FE of the control signal $S_C$.

In the present embodiment, the signal level in each step (i.e., the unit signal level $V_U$) is determined according to a pulse number of the phase interpolation signal $S_{PI}$ within the pulse duration of the phase leading signal DN/the phase lagging signal UP. Since the second frequency F2 is assumed to be 16 times as great as the first frequency F1, 16 pulses occur within the pulse duration of the phase leading signal DN/the phase lagging signal UP, and thus the unit signal level $V_U$ can be calculated as $(V_H-V_L)/16$.

With reference to FIG. 1 and FIG. 2B, the operation performed by the FSM 130, as provided in the embodiment illustrated in FIG. 2B, is similar to the embodiment illustrated in FIG. 2A, and the difference between the embodiments lies in that the second frequency F2 is assumed to be 8 times as great as the first frequency F1 (i.e., the divisor N is equal to 8), so as to optimize the linearity.

In view of the entire signal waveform of the control signal $S_C$, the rising edge RE and the falling edge FE are still respectively constructed within the pulse duration t3 of the phase leading signal DN and within the pulse duration t4 of the phase lagging signal UP. It shows that although the first frequency F1 of the input data signal $D_{IN}$ becomes twice as that set forth in the previous embodiment, the FSM 130 can generate the corresponding control signal $S_C$, such that the phase interpolator 120 performs the phase interpolation. Namely, when the frequency of the input data signal $D_{IN}$ is changed, the designer only has to adjust the divisor N of the divisor-controllable frequency divider 140 to meet the requirement for the operation frequency of the phase detector 110, and there is no need to adjust the operation frequency of the phase interpolator 120.

Figure 3:
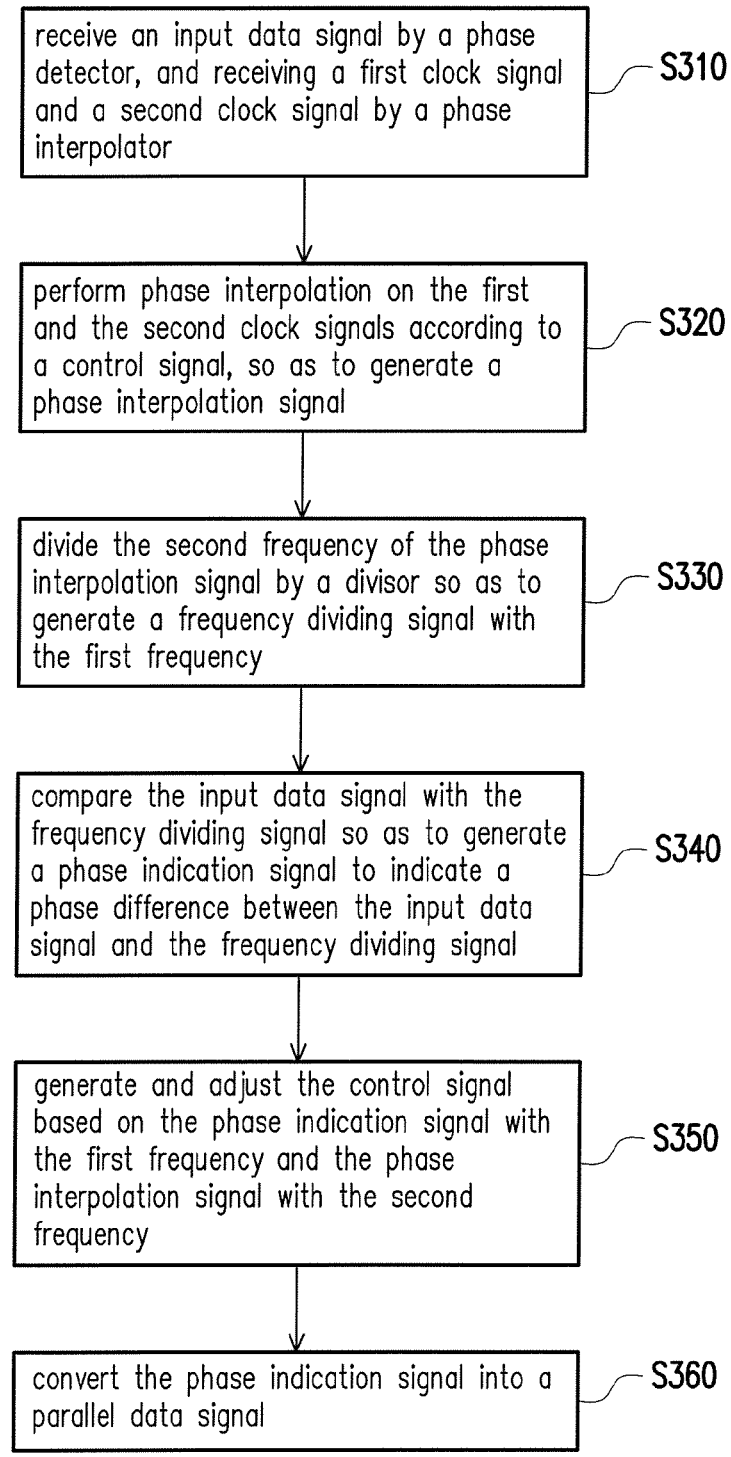
FIG. 3 is a flowchart of a clock and data recovery method according to an embodiment of the disclosure.

FIG. 3 is a flowchart of a CDR method according to an embodiment of the disclosure. As shown in FIG. 3, in step 310, the phase detector 110 receives the input data signal $D_{IN}$, and the phase interpolator 120 receives the first clock signal $S_I$ and the second clock signal $S_Q$. In the present embodiment, the phase detector 110 is operated at the first frequency F1, and the phase interpolator 120 is operated at the second frequency F2.

In step 320, the phase interpolator 120 may perform phase interpolation on the first and the second clock signals $S_I$ and $S_Q$ according to the control signal $S_C$, so as to generate the phase interpolation signal $S_{PI}$. After the phase interpolation signal $S_{PI}$ is generated, in step 330, the divisor-controllable frequency divider 140 divides the second frequency F2 of the phase interpolation signal $S_{PI}$ by the divisor N, so as to generate the frequency dividing signal $S_{PI}'$ with the first frequency F1. In the present embodiment, the divisor N is set according to the ratio of the first frequency F1 and the second frequency F2.

In step 340, the phase detector 110 may compare the input data signal $D_{IN}$ with the frequency dividing signal $S_{PI}'$, so as to generate the phase indication signal $S_{IND}$ for indicating the phase difference between the input data signal $D_{IN}$ and the frequency dividing signal $S_{PI}'$. Accordingly, in step S350, the FSM 130 may generate and adjust the control signal $S_C$ based on the phase indication signal $S_{IND}$ with the first frequency F1 and the phase interpolation signal $S_{PI}$ with the second frequency F2. In step 360, the de-serializer 160 may convert the phase indication signal $S_{IND}$ into a parallel data signal $D_{OUT}$ and transmit the parallel data signal $D_{OUT}$ to the back-end circuit.

Moreover, since those skilled in the art can be sufficiently derive the details of the CDR method provided in the exemplary embodiment of FIG. 3 from the descriptions of the embodiments depicted in FIG. 1 to FIG. 2B, the detailed descriptions of the CDR method will not be further provided hereinafter.

To sum up, in an embodiment of the invention, a CDR circuit and a CDR method are provided. By utilizing the divisor-controllable frequency divider in the proposed CDR circuit, the phase interpolator can be designed at the frequency with the highest linearity regardless of the frequency of the input data signal. Since the linearity of CDR circuit is mainly dominated by the performance of the phase interpolator, the proposed CDR circuit described herein can achieve features of wide operation frequency range without sacrificing the performance of linearity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A clock and data recovery circuit comprising:
   a phase detector comparing an input data signal with a frequency dividing signal and generating a phase indication signal to indicate a phase difference between the input data signal and the frequency dividing signal, wherein the phase detector is operated at a first frequency;
   a phase interpolator receiving a first clock signal, a second clock signal, and a control signal and performing phase interpolation on the first and the second clock signals according to the control signal, so as to generate a phase interpolation signal, wherein the phase interpolator is operated at a second frequency, and the second frequency is greater than the first frequency;
   a finite state machine coupled to the phase detector and the phase interpolator, the finite state machine generating the control signal based on the phase indication signal with the first frequency and the phase interpolation signal with the second frequency; and
   a divisor-controllable frequency divider coupled to the phase detector and the phase interpolator, the divisor-controllable frequency divider dividing the second frequency of the phase interpolation signal by a divisor, so as to generate the frequency dividing signal with the first frequency, wherein the divisor is set according to a ratio of the first frequency and the second frequency, wherein when the first frequency of the input data signal is changed, the divisor is adjusted according to the ratio of the changed first frequency and the unchanged second frequency.

2. The clock and data recovery circuit according to claim 1, wherein the phase interpolator is operated without changing frequency when the first frequency of the input data signal is changed.

3. The clock and data recovery circuit according to claim 1, wherein when the phase indication signal is a phase leading signal, the finite state machine increases a signal level of the control signal step-by-step for each pulse of the phase interpolation signal within a pulse duration of the phase leading signal, and the signal level in each step is determined according to a pulse number of the phase interpolation signal within the pulse duration.

4. The clock and data recovery circuit according to claim 3, wherein the signal level of the control signal is raised from a reference signal level to a maximum signal level within the pulse duration, so as to constitute a rising edge of the control signal.

5. The clock and data recovery circuit according to claim 1, wherein when the phase indication signal is a phase lagging signal, the finite state machine decreases a signal level of the control signal step-by-step for each pulse of the phase interpolation signal within a pulse duration of the phase lagging signal, and the signal level in each step is determined according to a pulse number of the phase interpolation signal within the pulse duration.

6. The clock and data recovery circuit according to claim 5, wherein the signal level of the control signal is dropped from a maximum signal level to a reference signal level within the pulse duration, so as to constitute a falling edge of the control signal.

7. The clock and data recovery circuit according to claim 1, further comprising:
   a phase-locked loop coupled to the phase interpolator, the phase-locked loop generating the first and the second clock signals.

8. The clock and data recovery circuit according to claim 1, further comprising:
   a de-serializer coupled to the phase detector, the de-serializer converting the input data signal into a parallel data signal according to the frequency dividing signal.

9. A clock and data recovery method comprising:
   receiving an input data signal by a phase detector and receiving a first clock signal and a second clock signal by a phase interpolator, wherein the phase detector is operated at a first frequency, and the phase interpolator is operated at a second frequency;
   performing phase interpolation on the first and the second clock signals according to a control signal, so as to generate a phase interpolation signal;
   dividing the second frequency of the phase interpolation signal by a divisor, so as to generate a frequency dividing signal with the first frequency, wherein the divisor is set according to a ratio of the first frequency and the second frequency, wherein when the first frequency of the input data signal is changed, adjusting the divisor according to the ratio of the changed first frequency and the unchanged second frequency;

comparing the input data signal with the frequency dividing signal, so as to generate a phase indication signal to indicate a phase difference between the input data signal and the frequency dividing signal;

generating and adjusting the control signal based on the phase indication signal with the first frequency and the phase interpolation signal with the second frequency; and converting the phase indication signal into a parallel data signal.

10. The clock and data recovery method according to claim 9, wherein the step of generating and adjusting the control signal based on the phase indication signal with the first frequency and the phase interpolation signal with the second frequency comprises:

when the phase indication signal is a phase leading signal, increasing a signal level of the control signal step-by-step for each pulse of the phase interpolation signal during rising time of the phase leading signal, wherein the signal level in each step is determined according to a pulse number of the phase interpolation signal during the rising time.

11. The clock and data recovery method according to claim 10, wherein the signal level of the control signal is raised from a reference signal level to a maximum signal level during the rising time, so as to constitute a rising edge of the control signal.

12. The clock and data recovery method according to claim 9, wherein the step of generating and adjusting the control signal based on the phase indication signal with the first frequency and the phase interpolation signal with the second frequency comprises:

when the phase indication signal is a phase lagging signal, decreasing a signal level of the control signal step-by-step for each pulse of the phase interpolation signal during rising time of the phase lagging signal, wherein the signal level in each step is determined according to a pulse number of the phase interpolation signal during the rising time.

13. The clock and data recovery method according to claim 12, wherein the signal level of the control signal is dropped from a maximum signal level to a reference signal level during the rising time, so as to constitute a falling edge of the control signal.

* * * * *